United States Patent [19]

Herbert et al.

[11] Patent Number: 4,849,805
[45] Date of Patent: Jul. 18, 1989

[54] RADIATION HARDENED INTEGRATED CIRCUIT AND METHOD OF MAKING THE SAME

[75] Inventors: Jeffrey C. Herbert, Lansdale, Pa.; Kenneth M. Schlesier, Stockton, N.J.

[73] Assignee: General Electric Company, Fairfield, Conn.

[21] Appl. No.: 123,199

[22] Filed: Nov. 20, 1987

[51] Int. Cl.$^4$ ............... H01L 29/78; H01L 27/02; H01L 27/12; H01L 29/34
[52] U.S. Cl. ............................ 357/23.7; 357/23.1; 357/41; 357/4; 357/51; 357/54; 357/59
[58] Field of Search ............... 357/4, 23.7, 49, 54, 357/59, 23.1, 41, 30, 51

[56] References Cited

U.S. PATENT DOCUMENTS

| | | | |
|---|---|---|---|
| 4,199,723 | 4/1980 | Goodman et al. | 357/4 |
| 4,242,156 | 12/1980 | Peel | 357/23.7 |
| 4,368,085 | 1/1983 | Peel | 357/23.7 |
| 4,609,930 | 9/1986 | Yamazaki | 357/4 |

FOREIGN PATENT DOCUMENTS

| | | | |
|---|---|---|---|
| 0002107 | 5/1979 | European Pat. Off. | 357/23.7 |
| 58-115850 | 7/1983 | Japan | 357/23.7 |
| 2118365 | 10/1983 | United Kingdom | 357/23.7 |

Primary Examiner—J. Carroll
Attorney, Agent, or Firm—K. R. Glick; B. E. Morris

[57] ABSTRACT

A SOI integrated circuit includes a plurality of islands of single crystalline silicon on a surface of a substrate of an insulating material. Each of the silicon islands contains an electrical component, such as a MOS transistor. A layer of silicon oxide is on the surface of the substrate between the islands and is slightly spaced, at least about 0.1 micrometers, from each of the silicon islands. A line of a conductive material, such as conductive polycrystalline silicon, extends over the silicon islands and between the silicon islands over the silicon oxide layer. The silicon oxide layer isolates the conductive line from the substrate so that any photocurrent generated in the substrate as a result of the integrated circuit being exposed to radiation will not flow through the conductive line to disrupt the circuit.

10 Claims, 1 Drawing Sheet

RADIATION HARDENED INTEGRATED CIRCUIT AND METHOD OF MAKING THE SAME

The Government has rights in this invention pursuant to subcontract No. A6ZV-700000-E-507 under Contract No. F 04704-84-C-0061 awarded by the Department of the Air Force.

FIELD OF INVENTION

The present invention relates to an improved radiation hardened integrated circuit and method of making the same. More particularly, the present invention relates to a silicon-on-insulator (SOI) integrated circuit which is protected against transient photocurrents from flowing in the insulated substrate when the integrated circuit is exposed to a transient radiation environment.

BACKGROUND OF THE INVENTION

Silicon-on-insulator (SOI) integrated circuits include a substrate of an insulating material, such as sapphire, spinel, beryllium oxide or the like, having islands of single crystalline silicon on a surface thereof. Each of the silicon islands contains an electrical component, such as a metal-oxide-silicon (MOS) field-effect transistor, and the electrical components are connected by lines of a conductive material, such as conductive polycrystalline silicon, which extend between the islands over the surface of the substrate. When a SOI integrated circuit containing MOS transistors encounters a pulse of high dose rate transient radiation, electron-hole pairs are generated in the substrate. The fringing field between the source and drain of an off MOS transistor collects these pairs and photocurrent will flow. Photocurrent will also flow between any two silicon lines (polycrystalline or single crystalline) which are at different potentials. This photocurrent flow is a major problem in many types of integrated circuits. Therefore, it would be desirable to have a SOI integrated circuit which includes means for blocking the flow of any photocurrent generated in the substrate.

SUMMARY OF THE INVENTION

An integrated circuit includes a substrate of an insulating material having a major surface and a plurality of spaced islands of single crystalline silicon on the major surface of the substrate. Each of the islands contains an electrical component, such as a MOS transistor. A layer of silicon oxide is on the surface of the substrate between the silicon islands and is spaced from the islands. At least one line of a conductive material extends between and electrically connects the electrical components in the islands and extends over the silicon oxide layer so as to be substantially spaced from the surface of the substrate.

DETAILED DESCRIPTION OF PREFERRED EMBODIMENT

Figure 1:
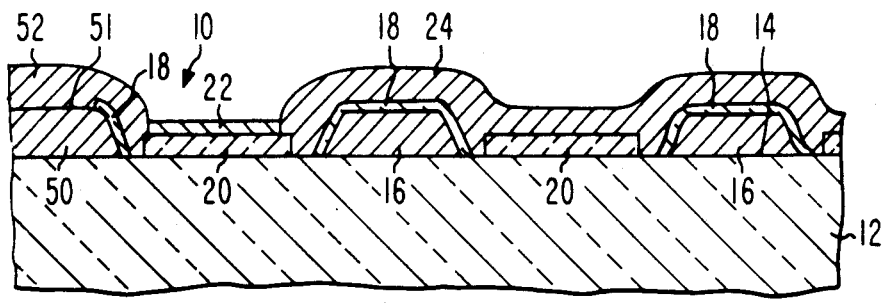
FIG. 1 is a sectional view of a form of a SOI integrated circuit which incorporates the present invention.

Referring initially to FIG. 1, an SOI integrated circuit which incorporates the present invention is generally designated as 10. The integrated circuit 10 includes a substrate 12 of an insulating material, such as sapphire, spinel, beryllium oxide, or the like, having a major surface 14. On the major surface 14 of the substrate 12 are a plurality of spaced islands 16 of single crystalline silicon. The silicon islands 16 are of a thickness of about 5,000 Angstroms. Each of the silicon islands 16 contains an electrical component. The silicon islands 16 will be described as containing MOS transistors, although they may contain other types of electrical components.

The silicon islands 16 may all be of the same conductivity type, or for a CMOS circuit, some of the islands 16 will be of one conductivity type while the others are of the opposite conductivity type. For a MOS transistor, each of the islands 16 contains spaced source and drains regions (not shown) of a conductivity type opposite to that of the island 16 and a channel region therebetween. Covering the surface of each of the silicon islands 16 is a thin layer 18 of silicon oxide. The portion of the silicon oxide layer 18 which extends over the channel region of the MOS transistor forms the gate oxide of the transistor.

On the surface 14 of the substrate 12 between the silicon islands 16 is a layer 20 of silicon oxide. The silicon oxide layer 20 is thinner than the silicon islands 16, being about 700 Angstroms in thickness. The silicon oxide layer 20 is spaced from the edges of the silicon islands 16 a distance of at least about 0.1 micrometers. A thin resistor layer 22 of conductive polycrystalline silicon is on the silicon oxide layer 20 between two of the silicon islands. The resistor layer 22 is of a thickness of about 700 Angstroms. Resistor layers 22 may be provided on the silicon oxide layer 20 in other areas depending on the particular circuit being formed.

A thick line 24 of conductive polycrystalline silicon extends across the channel portions of each of the silicon islands 16 and extends between the islands 16 over the silicon oxide layer 20. Thus, the polycrystalline silicon line 24 forms the gates of the MOS transistors and connects the gates in series. In addition, a thick line 52 of polycrystalline silicon contacts a silicon island 50 of a certain conductivity type to form a buried contact 51 to either the source or drain of another transistor in the desired circuit. However, where the polycrystalline silicon line 24 and the polycrystalline silicon line 52 meet the resistor layer 22 they each contact only an end of the resistor layer 22 so that the resistor is connected between the gate of one transistor and the source or drain of another transistor. Other conductive polycrystalline silicon lines, not shown, are provided on the substrate 12 extending between the sources and drains of the MOS transistors to connect the transistors in a desired circuit. Where each of such polycrystalline silicon lines extends between two silicon islands 16, it extends over the silicon oxide layer 20. Thus, in the integrated circuit 10 of the present invention, each of the conductive lines, such as the resistor 22 and conductive gate line 24, is spaced from the surface of the substrate 12 by the insulating silicon oxide layer 20. Therefore, the conductive lines are isolated from the substrate 12 so that any photocurrents which may be generated in the substrate 12 as a result of the integrated circuit 10 being exposed to transient radiation will not flow through the conductive lines and disrupt the circuit. Although the conductive line 24 is shown as extending into the space between the silicon oxide layer 20 and the islands 16, any contact between the conductive line 24 and the substrate surface 14 is so small that it will not cause the photocurrent to flow into the conductive line 24. The silicon oxide layer 20 is spaced from the islands 16 so that it will not make electrical contact with the islands 16 and thereby cause flow of current between the islands 16 by means of the silicon oxide layer 20. However, the spacing between the silicon oxide layer 20 and the silicon islands 16 should be maintained at a minimum.

To make the SOI integrated circuit 10 of the present invention, a layer of single crystalline silicon is epitaxially grown on the surface 14 of an insulated substrate 12. A layer of a photoresist is coated on the epitaxial silicon layer and using standard photolithographic techniques, the photoresist layer is defined to leave portions of the photoresist layer over the areas of the epitaxial silicon layer which are to form the silicon islands 16. The exposed portions of the epitaxial silicon layer are then removed using a suitable etching technique, such as a chemical etch or a glow discharge etch. This leaves the silicon islands 16 on the substrate surface 14.

Figure 2:
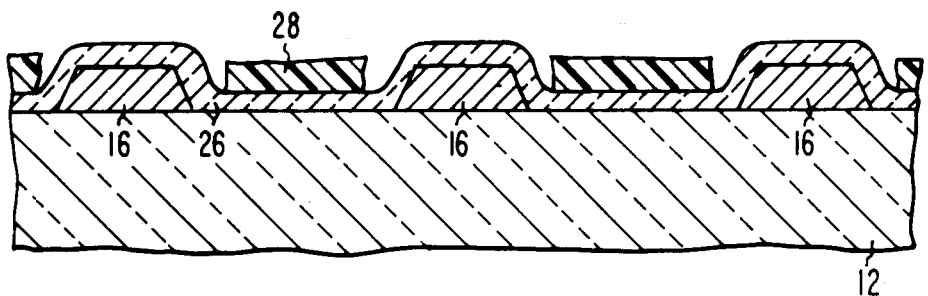
FIGS. 2 and 3 are sectional views illustrating various steps in the method of the present invention for making the integrated circuit shown in FIG. 1.

As shown in FIG. 2, a layer 26 of silicon oxide is deposited by standard chemical vapor deposition over the exposed areas of the substrate surface 14 and the silicon islands 16. A layer 28 of a photoresist is then coated over the silicon oxide layer 26, and, using standard photolithographic techniques, is defined to leave the photoresist layer 28 only over the area of the silicon oxide layer 26 which is on the substrate surface 14. This may be achieved by using a mask for defining the photoresist layer 28 which is the reverse of the mask used to define the photoresist layer used to form the silicon islands 16. For example, if the mask used to form the silicon islands 16 had opaque areas of the size corresponding to the silicon islands 16 surrounded by transparent area, the mask used to define the photoresist layer 28 will have transparent areas of the size and shape of the silicon islands 16 surrounded by opaque area. However, the transparent areas will be slightly larger than the opaque areas of the silicon island mask so that the defined areas of the photoresist layer 28 will be slightly spaced from the edges of the islands 16. After the photoresist layer 28 is defined, the exposed portion of the silicon oxide layer 26 is removed with a suitable etchant which will not attack the silicon islands, such as buffered hydrofluoric acid, leaving the silicon oxide layer 20 on the substrate surface 14 which is spaced from the silicon islands 16.

If the integrated circuit 10 is to be a CMOS circuit, some of the silicon islands 16 are doped to a conductivity type opposite the other islands 16. The epitaxial silicon layer from which the silicon islands 16 are formed is grown of one conductivity type, such as N-type. The silicon islands 16 which are to remain the one conductivity type are coated with a photoresist and the uncoated islands 16 are doped the opposite conductivity type, either by diffusion or ion implantation. The silicon oxide layer 18 is then formed over all of the silicon islands 16. This is achieved by heating the integrated circuit 10 in either air or a mixture of oxygen and water vapor to grow a thin silicon oxide layer 18 on the surface of the silicon islands 16.

Figure 3:
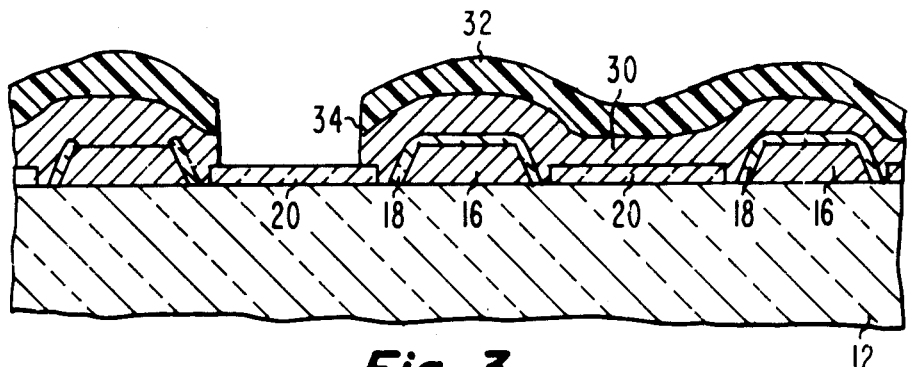

As shown in FIG. 3, a thick layer 30 of polycrystalline silicon is then deposited by chemical vapor deposition over the silicon oxide layers 18 on the silicon islands 16 and the silicon oxide layer 20 on the substrate surface 14. Some of the polycrystalline silicon layer 30 will also deposit in and fill the space between the silicon oxide layer 20 and the islands 16. The polycrystalline silicon layer 30 is coated with a photoresist layer 32 which is defined using standard photolithographic techniques to have opening 34 over the areas of the silicon oxide layer 20 where a resistor 22 is to be formed. The portion of the polycrystalline silicon layer 30 exposed by the opening 34 in the photoresist layer 32 is then removed with a suitable etchant to expose the silicon oxide layer 20 thereunder.

After the photoresist layer 32 is removed, a thin layer of polycrystalline silicon is deposited by chemical vapor deposition over the polycrystalline silicon layer 30 and the exposed surface of the silicon oxide layer 20, and suitably doped to form the resistor 22. The polycrystalline silicon layer 30 is then defined, using standard photolithographic techniques, to form the gate line 24 shown in FIG. 1, which extends over the channel regions in the silicon islands 16 and over the silicon oxide layer 20. As is well known in making MOS transistors, the source and drains regions of the transistors are then formed by doping the portions of the islands 16 on each side of the gate line 24 with a conductivity modifier of the type opposite to the conductivity type of the island 16 using the gate line 26 as a mask. This is generally done by ion implantation. After the source and drain regions of the transistors are formed, additional conductive lines of polycrystalline silicon can be formed on the integrated circuit 10 to connect the various source and drain regions in a desired circuit. This is generally achieved by depositing a layer of the conductive material over the integrated circuit and defining the layer by standard photolithographic techniques.

Thus there is provided by the present invention a SOI integrated circuit in which the conductive lines are isolated from the surface of the insulating substrate so that the flow of photocurrents generated in the substrate will be prevented through the conductive lines. This prevents damage to the integrated circuit from such photocurrents. The method of the present invention permits the integrated circuit of the present invention to be easily made since the insulating layer which isolates the conductive layer from the substrate is defined using a mask which is merely a reverse mask, slightly modified, of the mask used to define the silicon islands.

We claim:

1. An integrated circuit comprising:
    a substrate of insulating material having a major surface;
    a plurality of spaced islands of single crystalline silicon on said major surface of the substrate, each of said islands containing an electrical component;
    a layer of silicon oxide on said major surface of the substrate between said islands, said silicon oxide layer being slightly spaced from each of said islands; and
    at least one line of a conductive material extending between and electrically connecting the electrical components in said islands, said conductive line extending in the space between the silicon oxide layer and the silicon islands and extending over said silicon oxide layer so as to be substantially spaced from said surface of the substrate.

2. An integrated circuit in accordance with claim 1 in which the thickness of the silicon oxide layer on the substrate surface is less than the thickness of the silicon islands.

3. An integrated circuit in accordance with claim 2 in which the line is of conductive polycrystalline silicon.

4. An integrated circuit in accordance with claim 3 in which the silicon oxide layer is spaced from the silicon islands at least about 0.1 micrometers.

5. An integrated circuit in accordance with claim 3 in which each island contains an MOS transistor having a source region spaced from a drain region by a channel region and the conductive line extends over and is insulated from the channel region to serve as a gate.

6. An integrated circuit in accordance with claim 6 including a thin layer of silicon oxide over the surface of each of the silicon islands and the conductive line extends over the thin silicon oxide layer.

7. An integrated circuit in accordance with claim 3 including a resistor of a thin layer of doped polycrystalline silicon on the silicon oxide layer between two of said silicon islands and the conductive line extends to each end of the resistor.

8. An integrated circuit comprising:
   a substrate of insulating material having a major surface,
   a plurality of spaced islands of single crystalline silicon on said major surface of the substrate, each of said islands containing an electrical component and being covered with a layer of an insulating material;
   a layer of silicon oxide on said major surface of the substrate between said islands, said silicon oxide layer being slightly spaced from the insulating layer on each of said islands; and
   at least one line of a conductive material extending between and electrically connecting the electrical components in said islands and extending over said silicon oxide layer so as to be substantially spaced from said surface of the substrate.

9. An integrated circuit in accordance with claim 8 in which the thickness of the silicon oxide layer on the substrate surface is less than the thickness of the silicon islands.

10. An integrated circuit in accordance with claim 9 in which the silicon oxide layer is spaced from the insulating layer on the silicon islands at least about 0.1 micrometers.

* * * * *